United States Patent
Takahashi et al.

(10) Patent No.: US 10,361,191 B2
(45) Date of Patent: Jul. 23, 2019

(54) SEMICONDUCTOR DEVICE

(71) Applicant: Mitsubishi Electric Corporation, Tokyo (JP)

(72) Inventors: Tetsuo Takahashi, Tokyo (JP); Katsumi Uryu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/321,837

(22) PCT Filed: Aug. 26, 2014

(86) PCT No.: PCT/JP2014/072292
§ 371 (c)(1),
(2) Date: Dec. 23, 2016

(87) PCT Pub. No.: WO2016/030966
PCT Pub. Date: Mar. 3, 2016

(65) Prior Publication Data
US 2017/0162560 A1    Jun. 8, 2017

(51) Int. Cl.
*H01L 27/06* (2006.01)
*H01L 29/78* (2006.01)
(Continued)

(52) U.S. Cl.
CPC ...... *H01L 27/0635* (2013.01); *H01L 27/0727* (2013.01); *H01L 29/0834* (2013.01);
(Continued)

(58) Field of Classification Search
CPC ................ H01L 29/7397; H01L 25/18; H01L 2924/13055; H01L 2924/181; H01L 29/1095
See application file for complete search history.

(56) References Cited

U.S. PATENT DOCUMENTS

| 5,859,446 A | 1/1999 | Nagasu et al. |
| 2005/0045960 A1 | 3/2005 | Takahashi |

(Continued)

FOREIGN PATENT DOCUMENTS

| JP | H09-232597 A | 9/1997 |
| JP | 2004-363328 A | 12/2004 |

(Continued)

OTHER PUBLICATIONS

Notification of Transmittal of Translation of the International Preliminary Report on Patentability (Chapter I) and Translation of Written Opinion of the International Searching Authority; PCT/JP2014/072292; dated Mar. 9, 2017.
(Continued)

*Primary Examiner* — Tony Tran
(74) *Attorney, Agent, or Firm* — Studebaker & Brackett PC

(57) ABSTRACT

A semiconductor device includes a switching device region including an active region having a first conductivity-type emitter region formed on an upper surface side of a first conductivity-type substrate, a second conductivity-type base region formed on an upper surface side of the substrate, a second conductivity-type collector layer formed on a lower surface side of the substrate, and a diode region having a second conductivity-type anode layer formed on the upper surface side of the substrate and a first conductivity-type cathode layer formed on the lower surface side of the substrate, wherein the cathode layer is separated from the active region when planarly viewed, and on an upper surface side of the active region, a second conductivity type high-concentration region having an impurity concentration higher than that of the anode layer is formed.

6 Claims, 4 Drawing Sheets

(51) Int. Cl.

| | |
|---|---|
| *H01L 29/10* | (2006.01) |
| *H01L 29/417* | (2006.01) |
| *H01L 29/739* | (2006.01) |
| *H01L 29/861* | (2006.01) |
| *H01L 27/07* | (2006.01) |
| *H01L 29/08* | (2006.01) |
| *H01L 29/40* | (2006.01) |
| *H01L 29/16* | (2006.01) |
| *H01L 29/20* | (2006.01) |

(52) U.S. Cl.
CPC ........ *H01L 29/1004* (2013.01); *H01L 29/417* (2013.01); *H01L 29/7397* (2013.01); *H01L 29/78* (2013.01); *H01L 29/861* (2013.01); *H01L 29/1608* (2013.01); *H01L 29/2003* (2013.01); *H01L 29/402* (2013.01); *H01L 29/8611* (2013.01); *H01L 29/8613* (2013.01)

(56) References Cited

U.S. PATENT DOCUMENTS

| | | | |
|---|---|---|---|
| 2005/0258493 | A1 | 11/2005 | Aono et al. |
| 2007/0108468 | A1 | 5/2007 | Takahashi |
| 2008/0048295 | A1 | 2/2008 | Takahashi |
| 2008/0093697 | A1 | 4/2008 | Kaneda et al. |
| 2008/0102576 | A1 | 5/2008 | Suzuki et al. |
| 2013/0087829 | A1* | 4/2013 | Tanabe .............. H01L 29/66348 257/140 |
| 2013/0248924 | A1 | 9/2013 | Matsudai et al. |
| 2014/0084337 | A1 | 3/2014 | Matsudai et al. |
| 2016/0329323 | A1 | 11/2016 | Iwasaki et al. |

FOREIGN PATENT DOCUMENTS

| | | |
|---|---|---|
| JP | 2005-101514 A | 4/2005 |
| JP | 2005-317751 A | 11/2005 |
| JP | 2007-134625 A | 5/2007 |
| JP | 2008-053648 A | 3/2008 |
| JP | 2008-103590 A | 5/2008 |
| JP | 2008-109028 A | 5/2008 |
| JP | 2011-210800 A | 10/2011 |
| JP | 2012-216577 A | 11/2012 |
| JP | 2012-244071 A | 12/2012 |
| JP | 2013-201237 A | 10/2013 |
| JP | 2014-103376 A | 6/2014 |
| JP | 2015-118991 A | 6/2015 |

OTHER PUBLICATIONS

International Search Report issued in PCT/JP2014/072292; dated Dec. 9, 2014.
Hideki Takahashi et al. (2004) "1200V Reverse Conducting IGBT" Proceedings of 2004 International Symposium on Power Semiconductor Devices & ICs, pp. 133-136.
Dinesh Kumar et al. (2007) "RC-TCIGBT: A Reverse Conducting Trench Clustered IGBT" Proceedings of the 19th International Symposium on Power Semiconductor Devices & ICs, pp. 161-164.
M. Rahimo et al. (2009) "The Bi-mode Insulated Gate Transistor (BIGT) A Potential Technology for Higher Power Applications" IEEE, pp. 283-286.
An Office Action; "Notification of Reasons for Rejection", issued by the Japanese Patent Office dated Jul. 18 2017, which corresponds to Japanese Patent Application No. 2016-545123 and is related to U.S. Appl. No. 15/321,837; with partial English language translation.
An Office Action issued by the Korean Patent Office dated Jan. 15, 2018, which corresponds to Korean Patent Application 10-2017-7005295 and is related to U.S. Appl. No. 15/321,837.
An Office Action; "Notification of Reasons for Refusal," issued by the Japanese Patent Office dated Oct. 17, 2017, which corresponds to Japanese Patent Application No. 2016-545123 and is related to U.S. Appl. No. 15/321,837; with English language translation.
An Office Action issued by the Korean Patent Office dated Jul. 24, 2018, which corresponds to Korean Patent Application No. 10-2017-7005295 and is related to U.S. Appl. No. 15/321,837; with English language translation.
The First Office Action mailed by the State Intellectual Property Office of the People's Republic of China dated Jan. 22, 2019, which corresponds to Chinese Patent Application No. 201480081528.4 and is related to U.S. Appl. No. 15/321,837.

* cited by examiner

SEMICONDUCTOR DEVICE

TECHNICAL FIELD

The present invention relates to a semiconductor device used in, for example, a switch, an air-conditioner, a refrigerator, a washing machine, a bullet train, an electric train, a hybrid car, a converter for photovoltaic generation or wind-power generation, and the like.

BACKGROUND ART

Patent Literature 1 discloses a semiconductor device in which an IGBT and a reflux diode are integrated on the same chip. In the semiconductor device, in order to reduce an on voltage of the TGBT, an end of a cathode region is separated in a direction away from an IGBT part by a distance which is 100 μm longer than a distance between an end of an anode region and the IGBT part.

PRIOR ART

Patent Literature

Patent Literature 1 Japanese Patent Laid-Open No. 2004-363328

SUMMARY

Technical Problem

A semiconductor device in which a switching device region and a diode region are integrated on one chip is advantageous to miniaturization of a device more than a semiconductor device in which a switching device and a diode are disposed as different parts. However, in a reflux mode, a current flowing in a parasitic diode in a switching device region is disadvantageously added to a current flowing in a diode region. As a result, a recovery current disadvantageously increases.

The present invention has been made to solve the above problems, and has as its object to provide a semiconductor device in which a recovery current can be reduced.

Means for Solving the Problems

A semiconductor device according to the invention of the present application includes a switching device region including an active region having a first conductivity-type emitter region formed on an upper surface side of a first conductivity-type substrate, a second conductivity-type base region formed on an upper surface side of the substrate, a second conductivity-type collector layer formed on a lower surface side of the substrate, and a diode region having a second conductivity-type anode layer formed on the upper surface side of the substrate and a first conductivity-type cathode layer formed on the lower surface side of the substrate, wherein the cathode layer is separated from the active region when planarly viewed, and on an upper surface side of the active region, a second conductivity type high-concentration region having an impurity concentration higher than that of the anode layer is formed.

Other characteristics of the present invention will be clearly described below.

Advantageous Effects of Invention

According to the present invention, since a cathode layer is separated from an active region when planarly viewed, a second-conductivity type high-concentration region having an impurity concentration higher than that of an anode region is formed on an upper surface side of the active region, a recovery current can be reduced while maintaining characteristics of a switching device region.

DESCRIPTION OF THE EMBODIMENTS

Figure 1:
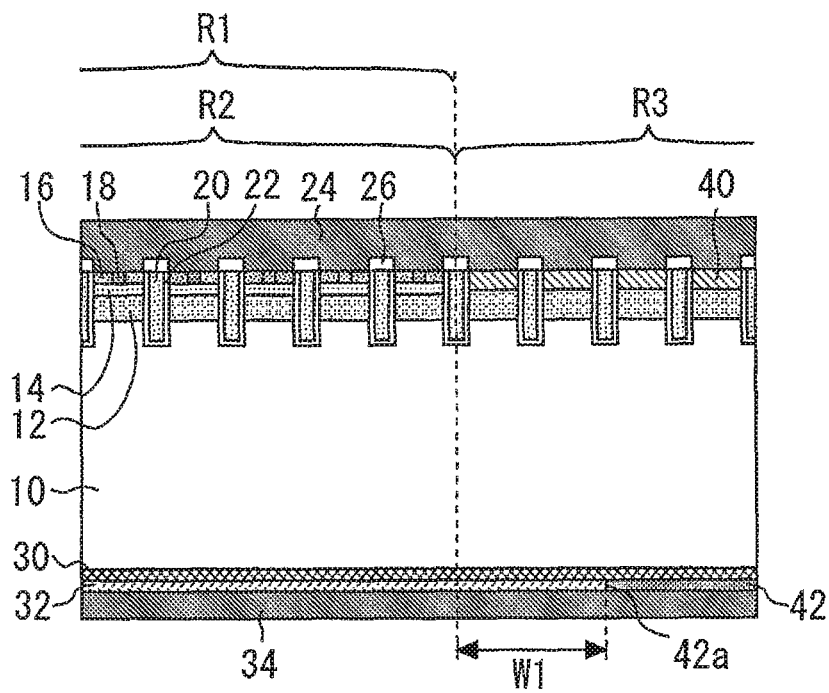
FIG. 1 is a partially cut-away view of the semiconductor device according to Embodiment 1.

A semiconductor device according to an embodiment of the present invention will be described below with reference to the accompanying drawings. The same reference symbols as in the drawings denote the same or corresponding constituent elements, and a repetitive description may not be given.

Embodiment 1

An n-type conductivity is called a first conductivity, and a p-type conductivity is called a second conductivity. A semiconductor device according to Embodiment 1 of the present invention is a Reverse-Conducting Insulated Gate Bipolar Transistor (RC-IGBT) in which an MAT and a reflux diode (Free Wheeling Diode (FWD)) are integrated on one chip. FIG. 1 is a partially cut-away view of the semiconductor device according to Embodiment 1 of the present invention. The semiconductor device includes a first conductivity-type substrate 10. The substrate 10 is made of, for example, Si, GaN, or SiC. On the substrate 10, an active region R2 constituting a part of a switching device region R1 and a diode region R3 are formed.

The active region R2 will be described below. On the upper surface side of the substrate 10, a first conductivity-type carrier store region 12 is formed. The carrier store region 12 has an impurity concentration higher than the impurity concentration of the substrate 10. A second conductivity-type base region 14 located above the carrier store region 12 is formed on the upper surface side of the substrate 10. A first conductivity-type emitter region 16 located above the base region 14 is formed on the upper surface side of the substrate 10. The emitter region 16 has an impurity concentration higher than the impurity concentration of the carrier store region 12. A second conductivity-type $P^+$ contact region 18 adjacent to the emitter region 16 is formed on the base region 14. The $P^+$ contact region 18 has an impurity concentration higher than the impurity concentration of the base region 14.

A trench gate electrode 20 penetrating the carrier store region 12 and the base region 14 is formed on the upper surface side of the substrate 10. The trench gate electrode 20 is made of, for example, polysilicon. The side surface and the lower surface of the trench gate electrode 20 are covered with a gate insulating film 22. The emitter region 16, the base region 14, the carrier store region 12, and the substrate 10 are in contact with the gate insulating film 22. An upper surface electrode 24 is formed on the upper surface of the substrate 10. The P+ contact region 18 is formed between the base region 14 and the upper surface electrode 24. In order to prevent the upper surface electrode 24 and the trench gate electrode 20 from being in contact with each other, an insulating interlayer 26 is formed therebetween. In this manner, an n-channel MOSFET structure is formed on the upper surface side of the active region R2.

A first conductivity type buffer layer 30 is formed on the lower surface side of the substrate 10. A second conductivity-type collector layer 32 located below the buffer layer 30 is formed on the lower surface side of the substrate 10, A lower surface electrode 34 is formed on the lower surface of the collector layer 32.

The diode region R3 will be described. The carrier store region 12 is formed on the upper surface side of the substrate 10. A second conductivity-type anode layer 40 located above the carrier store region 12 is formed on the upper surface side of the substrate 10. The anode layer 40 has an impurity concentration lower than the impurity concentration of the base region 14 and lower than the impurity concentration of the P+ contact region 18. The impurity concentration of the carrier store region 12 formed between the anode layer 40 and the substrate 10 is higher than the impurity concentration of the substrate 10. The upper surface electrode 24 is formed on the upper surface of the anode layer 40.

As in the active region R2, the trench gate electrode 20 and the gate insulating film 22 are also formed in the diode region R3. The trench gate electrode 20 penetrates the anode layer 40 and the carrier store region 12.

On the lower surface side of the substrate 10, the first conductivity-type buffer layer 30 is formed. A first conductivity-type cathode layer 42 located below the buffer layer 30 is formed on the lower surface side of the substrate 10. The cathode layer 42 has an impurity concentration higher than the impurity concentration of the substrate 10. The lower surface electrode 34 is formed on the lower surface of the cathode layer 42. In this manner, a PIN diode is formed in the diode region R3.

The collector layer 32 extends from a boundary between the active region R2 and the diode region R3 toward the diode region R3 by a distance W1. An end 42a of the cathode layer 42 moves backward from the boundary by the distance W1 in a direction away from the active region R2 when planarly viewed. The distance W1 may also be called a backward movement distance.

Figure 2:
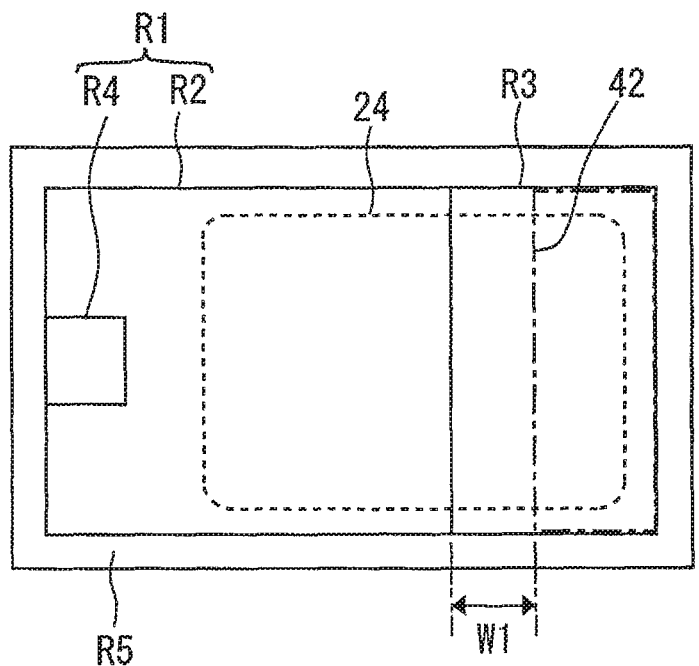
FIG. 2 is a plan view of the semiconductor device according to Embodiment 1.

FIG. 2 is a plan view of the semiconductor device according to Embodiment 1 of the present invention. The switching device region R1 has the active region R2 and a gate region R4, A gate electrode is formed on the surface of the gate region R4. The contour of the upper surface electrode 24 is indicated by a broken line. The upper surface electrode 24 functions as an emitter electrode in the active region R2, and functions as an anode electrode in the diode region R3. The contour of the cathode layer 42 is indicated by a chain line. The cathode layer 42 is separated from the active region R2 by the distance W1 when planarly viewed. An outer peripheral region R5 is formed on the outer periphery of the semiconductor device.

An operation of the semiconductor device according to Embodiment 1 of the present invention will be described. In a forward stationary operation of the switching device, electrons flow from the upper surface electrode 24 into the substrate 10 through the n-channel MOSFET in the active region R2. The lower surface of the substrate 10 has a structure called anode short, and an electron current flows from the buffer layer 30 into the lower surface electrode 34 (collector electrode) through the cathode layer 42 first. When a junction between the collector layer 32 and the buffer layer 30 is forwardly biased, holes flow from the collector layer 32 to the substrate 10 to start conductivity modulation and to set a stationary state.

When the n-channel MOSFET in the active region R2 is turned off, excess earners in the substrate 10 are discharged from the base region 14, the P+ contact region 18, and the anode layer 40 to the upper surface electrode 24 to set the switching device to an off state.

When the potential of the upper surface electrode 24 becomes higher than the potential of the lower surface substrate 34, an operations in a reflux mode (FWD) mode is started. Operations in the reflux mode change depending on gate potentials. A case in which the gate potential is set at 0 V will be described below. An ideal ON state (stationary state) of a diode is a state in which holes flow from the anode layer 40 to the substrate 10 through the carrier store region 12 to cause a current to flow into the cathode layer 42. More specifically, it is ideal that the current is constituted by only the holes flowing from the anode layer 40 to the substrate 10.

Figure 3:
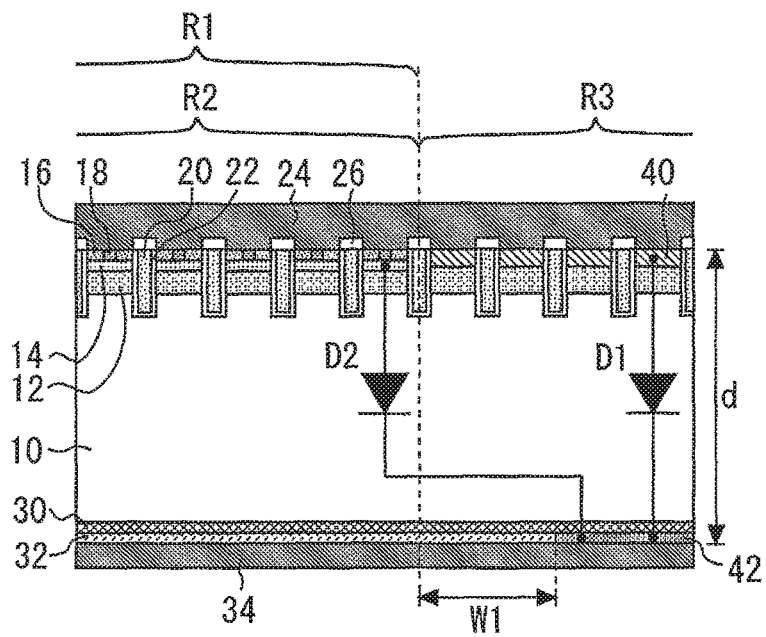
FIG. 3 is a partially cutaway sectional view of a semiconductor device to which a circuit symbol is added.

However, the active region R2 actually contributes to the current. This point will be described with reference to FIG. 3. FIG. 3 is a partially cutaway sectional view of a semiconductor device to which a circuit symbol is added. In the reflux mode, a current flows into, in addition to a diode D1, a diode D2 configured by the P+ contact region 18, the base region 14, the carrier store region 12, the substrate 10, and the cathode layer 42. Thus, in the reflux mode, the current in the diode D2 is superposed on the current in the diode D1.

When the potential of the lower surface electrode 34 becomes higher than the potential of the upper surface electrode 24, the carriers are gradually swept to start an OFF operation (recovery operation) of the diode. A recovery current flows from the lower surface electrode 34 to the upper surface electrode 24 while the diode D2 is forwardly biased. Thereafter, when the diode D2 is not forwardly biased, and the diode D2 is in an OFF state when the carriers in the substrate 10 are eliminated.

In this manner, the base region 14 and the P+ contact region 18 in the active region R2 disadvantageously operate as an anode. In order to suppress the current generated by the diode D2, the impurity concentrations of the base region 14 and the P+ contact region 18 need only be reduced. However, since the base region 14 is a part for determining a threshold voltage of the n-channel MOSFET, the concentration of the base region 14 cannot be easily reduced. Since the P+ contact region 18 must have a high concentration to reduce a contact resistance, the P+ contact region 18 cannot be easily reduced. When the impurity concentrations of the base region 14 and the P+ contact region 18 serving as an anode are high, a recovery current become large because a large number of carriers are left in the substrate 10 in a recovery state.

In Embodiment 1 of the present invention, in order to prevent a recovery current from increasing, the cathode layer 42 is separated from the active region R2 when planarly viewed. Therefore, an i layer of the diode D2 serving as a parasitic PIN diode can be elongated. More specifically, when the thickness of the substrate is given by d, the length of the i layer can be expressed by $\sqrt{(d^2+W1^2)}$. This length is larger than the length "d" of the i layer obtained when the cathode layer is formed up to the boundary between the diode region P3 and the active region R2. In this manner, since a current generated by the diode D2 can be suppressed, the recovery current can be reduced. The impurity concentration of the anode layer 40 is lower than the impurity concentration of the base region 14 and the impurity concentration of the P+ contact region 18, the recovery current can be suppressed. In this manner, the recovery current can be reduced, switching losses Eon, Err, and the like decrease to improve breakdown withstand.

In the semiconductor device according to Embodiment 1 of the present invention, when a second conductivity-type high-concentration region having an impurity concentration higher than that of the anode layer 40 is formed on the upper surface side of the active region R2, a recovery current can be suppressed from being increased by the high-concentration region. In Embodiment 1, the base region 14 and the P+ contact region 18 are high-concentration regions. However, any one of the base region 14 and the P+ contact region 18 may be the high-concentration region, or a region except for the base region and the P+ contact region may be defined as the high-concentration region.

Figure 4:
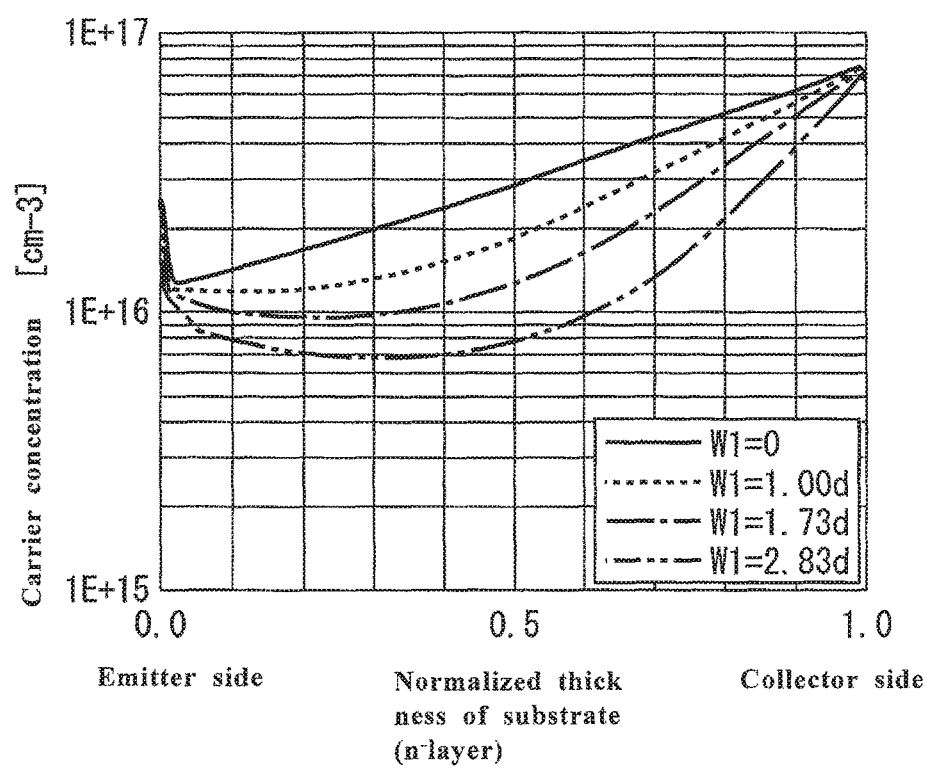
FIG. 4 is a graph showing a relationship between the backward movement distance and the carrier concentration of the substrate in a flux mode.

A backward movement distance W1 will be examined. FIG. 4 is a graph showing a relationship between the backward movement distance W1 and the carrier concentration of the substrate 10 in a flux mode. FIG. 4 shows a simulation result obtained by using a model in which the backward movement distance is reflected on the length of a one-dimension diode substrate (i layer). According to the simulation result, it is understood that the backward movement distance W1 is increased to reduce the carrier concentration of the substrate. In particular, when the backward movement distance W1 is set to be 1.5 or more times the substrate thickness, a carrier concentration at the center of the substrate can be approximately half that obtained when W1=0. For this reason, the recovery current can be sufficiently reduced. Thus, a distance (backward movement distance W1) between the cathode layer 42 and the active region R2 is preferably made 1.5 or more times the thickness d of the substrate 10.

Figure 5:
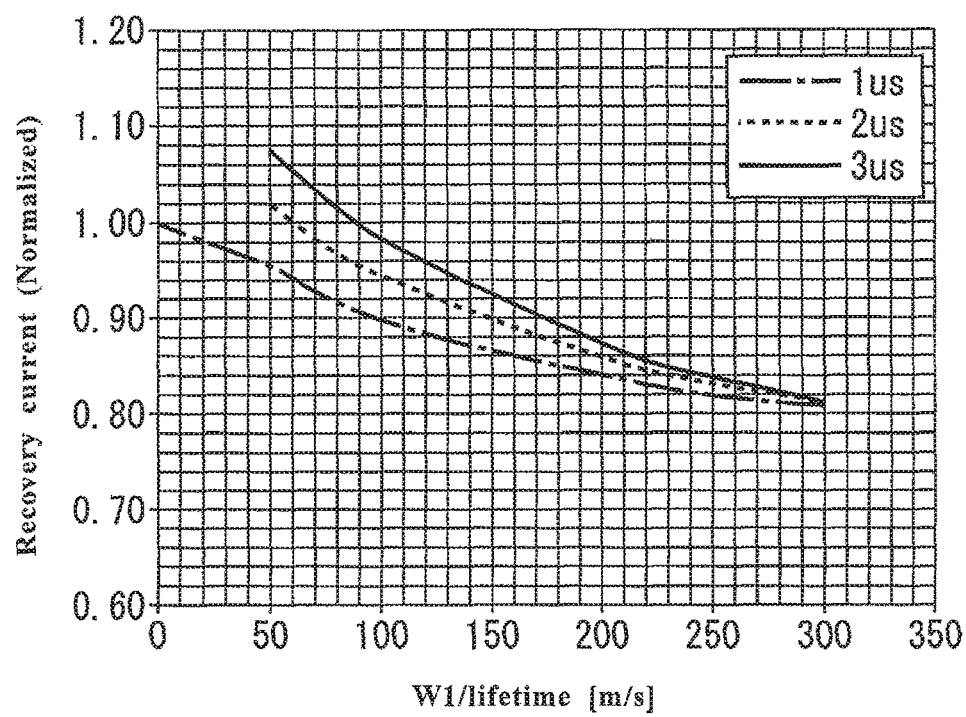
FIG. 5 is a graph showing a relationship between the backward movement distance and the recovery current.

FIG. 5 is a graph showing a relationship between the backward movement distance W1 and the recovery current. A lifetime in FIG. 5 means a lifetime of holes in the substrate 10. The value of the lifetime may be calculated by simulation or a microwave photoconductivity decay method. FIG. 5 shows recovery currents when the lifetimes are 1 μsec, 2 μsec, and 3 μsec, respectively.

When the backward movement distance W1 is gradually increased, the recovery current decreases and converges at a certain value. When the value of W1/lifetime (the left side of/is a numerator, and the right side is a denominator) is 100 or more, the recovery current can be reduced by 10 to 20% in comparison with the case in which the value is about 50. Thus, a distance (backward movement distance W1) when planarly viewed is preferably equal to or longer than a length obtained by the lifetime [s] of the carriers×100 in units of meters and seconds in the substrate. Since the recovery current converges in a region in which the value of W1/lifetime is 300 or more, even though the value is made larger than 300, a recovery current suppressing effect is not considerably improved, and the device is merely increased in size. Thus, the value of W1/lifetime is preferably set to 100 to 300.

When the results in FIGS. 4 and 5 are integrated with each other, W1 is preferably set to 1.5 d or more, and the value of W1/lifetime preferably falls within the range of 100 to 300.

The semiconductor device according to Embodiment 1 of the present invention can be variously modified as long as the characteristics of the semiconductor device are not lost. For example, a planer gate structure may be formed in an active region. Although the n type is defined as the first conductivity type and the p type is defined as the second conductivity type, the conductivity types may be reversed. Positional relationships between the gate region R4, the active region R2, and the diode region R3 are not limited to positional relationships in FIG. 2. For example, the active region R2 may be formed to surround the diode region R3. The diode region R3 may be formed to surround the switching device region R1. Furthermore, the diode region R3 may be formed to be in contact with both the active region R2 and the gate region R4. The carrier store region 12 and the buffer layer 30 may be omitted. These modifications can also be arbitrarily applied to a semiconductor device according to the following embodiment.

Since the semiconductor device according to the following embodiment and that in Embodiment 1 have a large number of common points, different points between the present embodiment and Embodiment 1 will be mainly described.

Embodiment 2

Figure 6:
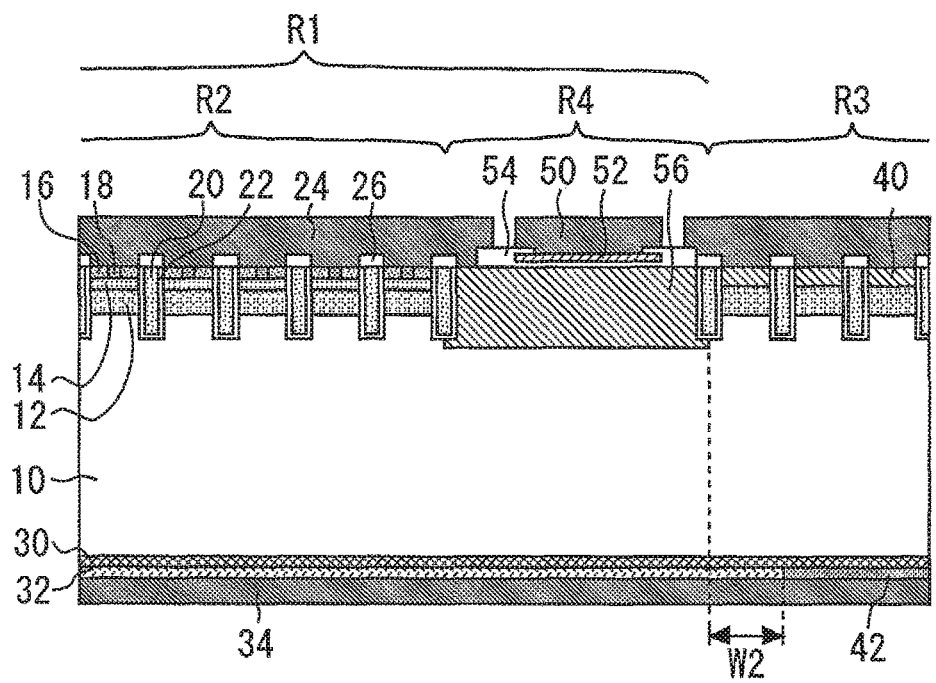
FIG. 6 is a partially cutaway sectional view of a semiconductor device according to Embodiment 2.

FIG. 6 is a partially cutaway sectional view of a semiconductor device according to Embodiment 2 of the present invention. The switching device region R1 has the gate region R4 between the active region R2 and the diode region R3. A gate electrode 50 is formed in the gate region R4. The gate electrode 50 is a part which receives an external gate drive signal. A gate line 52 connected to the gate electrode 50 is disposed in the gate region R4. The gate line 52 connects the gate electrode 50 and the trench gate electrode 20 to each other. An insulator 54 is formed below the gate electrode 50 and the gate line 52. A second conductivity-type well region 56 is formed in the substrate 10 in the gate region R4. The well region 56 is formed up to a position deeper than that of the anode layer 40 in the substrate 10. The impurity concentration of the well region 56 is higher than the impurity concentration of the anode layer 40.

Figure 7:
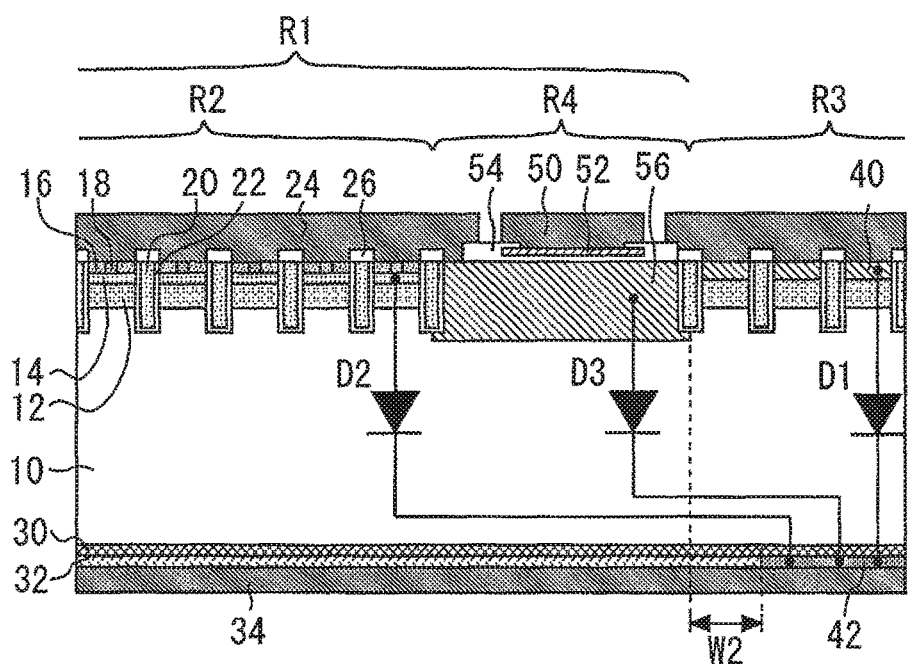
FIG. 7 is a partially cutaway sectional view of a semiconductor device showing the diode formed by forming a well region.

The well region 56 is connected to the upper surface electrode 24. For this reason, the well region 56 functions as a parasitic anode in a reflux mode (FWD mode). Thus, the cathode layer 42 is separated from the well region 56 when planarly viewed. A distance between the cathode layer 42 and the well region 56 when planarly viewed is given by W2. FIG. 7 is a partially cutaway sectional view of a semiconductor device showing the diode D3 formed by forming a well region. Since an end of the cathode layer 42 is moved backward from a boundary between the gate region R4 and the diode region R3 in a direction away from the gate region R4, the i layer of the diode D3 becomes long accordingly. Thus, a recovery current can be reduced.

As described above, the gate region R4 is formed between the active region R2 and the diode region R3 to make it possible to optimize arrangements of the devices. By applying the consideration of the backward movement distance W1 described in Embodiment 1, the W2 is preferably set to 1.5 d or more, or the value of W2/lifetime is preferably set within the range of 100 to 300.

Embodiment 3

Figure 8:
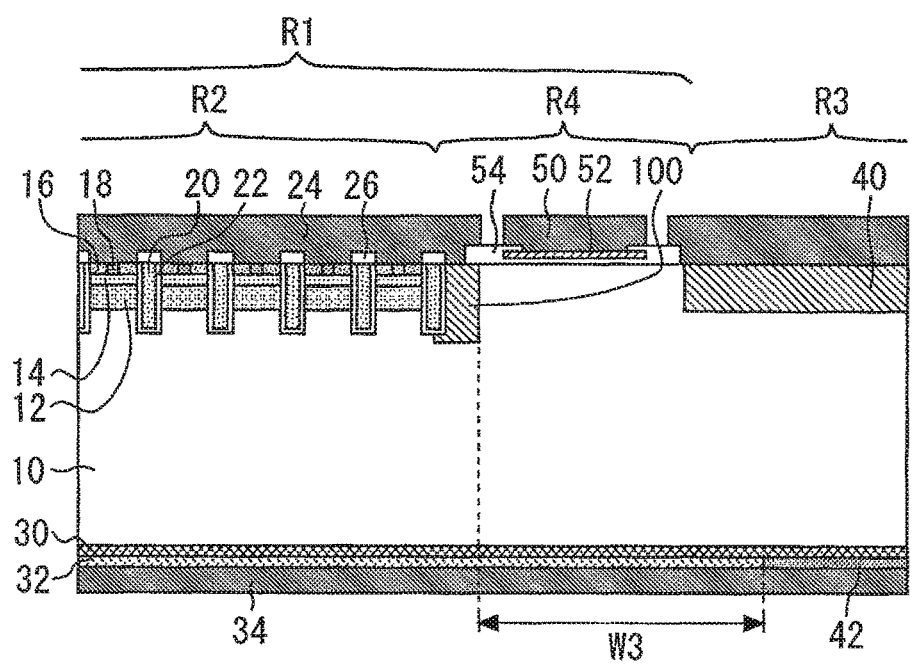
FIG. 8 is a partially cutaway sectional view of a semiconductor device according to Embodiment 3.

FIG. 8 is a partially cutaway sectional view of a semiconductor device according to Embodiment 3 of the present invention. A second conductivity-type well region 100 is formed on the active region R2 side of the gate region R4, and is not formed on the diode region R3 side of the gate region R4. In the diode region R3, a trench gate electrode, a gate oxide film, and a carrier store region are not formed. For this reason, only the anode layer 40 is formed on the upper surface side of the substrate 10 of the diode region R3.

A distance between the cathode layer 42 and the well 100 when planarly viewed is given by W3. Since the well region 100 is formed on only the active region R2 side, when the end of the cathode layer 42 is formed at the same position as that in Embodiment 2, the distance W3 becomes long. Thus, the recovery current can be sufficiently reduced. Since the well region 100 is formed on only the active region R2 side, even though the end of the cathode layer 42 is moved to the gate region R4 side, the recovery current can be sufficiently reduced.

As described above, in the semiconductor device according to Embodiment 3 of the present invention, since the well region 100 is formed on the active region R2 side, the cathode layer need not be largely moved backward. Thus, since a countermeasure such as an increase in size of the diode region by a backward movement of the cathode layer need not be made, the diode region can be reduced in size.

The characteristics of the semiconductor devices according to the embodiments described above may be arbitrarily combined to each other to enhance the advantageous effects of the present invention.

DESCRIPTION OF SYMBOLS 10 substrate, 12 carrier store region, 14 base region, 16 emitter region, 18 P+ contact region, 20 trench gate electrode, 22 gate insulating film, 24 upper surface electrode, 26 insulating interlayer, 30 buffer layer, 32 collector layer, 34 lower surface electrode, 40 anode layer, 42 cathode layer, 50 gate electrode, 52 gate line, 54 insulator, 56,100 well region, R1 switching device region, R2 active region, R3 diode region, R4 gate region

The invention claimed is:

1. A semiconductor device comprising:
a switching device region including an active region having a first conductivity-type emitter region formed at an upper surface of a semiconductor substrate, a second conductivity-type base region formed on an upper surface side of the semiconductor substrate and adjacent the first conductivity-type emitter region, a gate electrode, a second conductivity-type collector layer formed on a lower surface side of the semiconductor substrate, and a first conductivity-type region between the base region and the collector layer;
a diode region having a second conductivity-type anode layer formed on the upper surface side of the semiconductor substrate and a first conductivity-type cathode layer formed on the lower surface side of the semiconductor substrate; and
an upper surface electrode formed on the upper surface of the substrate, wherein
the cathode layer is separated from the active region such that no cathode layer portion overlaps with the active region when planarly viewed,
at an upper surface of the semiconductor substrate in the active region, a second conductivity-type high concentration region having an impurity concentration higher than that of the anode layer is formed,
the switching device region has a gate region in which an external gate electrode and a conductive gate line are formed between the active region and the diode region, the conductive gate line connecting the external gate electrode and the gate electrode,
the semiconductor device comprising a second conductivity-type well region formed on the semiconductor substrate in the gate region, wherein the cathode layer is separated from the well region when planarly viewed,
the external gate electrode and the conductive gate line are disposed above the upper surface of the semiconductor substrate, and
the second conductivity-type high concentration region is a P+ contact region having an impurity concentration higher than that of the base region.

2. The semiconductor device according to claim 1, wherein the high concentration region is the base region.

3. The semiconductor device according to claim 1, wherein
a distance between the cathode layer and the active region when planarly viewed is equal to or longer than a length obtained by lifetime of carriers×100 in units of meters and seconds in the semiconductor substrate.

4. The semiconductor device according to claim 1, wherein
the distance between the cathode layer and the active region when planarly viewed is 1.5 or more times a thickness of the semiconductor substrate.

5. The semiconductor device according to claim 1, wherein
the well region is formed on the active region side of the gate region and is not formed on the diode region side of the gate region.

6. The semiconductor device according to claim 1, comprising
a first conductivity-type carrier store region formed between the anode layer and the semiconductor substrate and having an impurity concentration higher than that of the semiconductor substrate.

* * * * *